(12) United States Patent
Xu et al.

(10) Patent No.: US 12,471,369 B2
(45) Date of Patent: Nov. 11, 2025

(54) DISPLAY PANEL AND DISPLAY DEVICE

(71) Applicant: Wuhan China Star Optoelectronics Technology Co., Ltd., Wuhan (CN)

(72) Inventors: Zuoyuan Xu, Wuhan (CN); Ronglei Dai, Wuhan (CN); Qiang Gong, Wuhan (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 58 days.

(21) Appl. No.: 17/610,709

(22) PCT Filed: Aug. 9, 2021

(86) PCT No.: PCT/CN2021/111410
§ 371 (c)(1),
(2) Date: Jan. 26, 2023

(87) PCT Pub. No.: WO2023/000400
PCT Pub. Date: Jan. 26, 2023

(65) Prior Publication Data
US 2024/0047480 A1 Feb. 8, 2024

(30) Foreign Application Priority Data
Jul. 22, 2021 (CN) .......................... 202110828557.4

(51) Int. Cl.
*G09G 5/00* (2006.01)
*H10D 86/40* (2025.01)
*H10D 86/60* (2025.01)

(52) U.S. Cl.
CPC .......... *H10D 86/60* (2025.01); *H10D 86/443* (2025.01)

(58) Field of Classification Search
CPC ................ G09G 5/00; G09G 2300/04; G09G 2300/0408; G09G 2310/0264;
(Continued)

(56) References Cited

U.S. PATENT DOCUMENTS 9,835,917 B2 * 12/2017 Zhao .................... H10D 86/441
12,199,108 B2 * 1/2025 Xu ....................... H10D 86/443
(Continued)

FOREIGN PATENT DOCUMENTS

CN 104916242 A 9/2015
CN 105096780 A 11/2015
(Continued)

Primary Examiner — Joe H Cheng
(74) Attorney, Agent, or Firm — Nathan & Associates Patent Agents Ltd.; Menachem Nathan (57) ABSTRACT

A display panel is provided. In the display panel, a plurality of first output terminals are arranged along an extending direction of a first side of a drive chip, a plurality of second output terminals are disposed on a side of the first output terminals away from a display area, and the plurality of second output terminals are disposed in an area between the plurality of first output terminals and an input terminal. Each second fan-out trace is electrically connected with a corresponding second output terminal through a second side of an adjacent drive chip, so that the drive chip can be moved upward as a whole and a lower frame can be reduced. A display device is also provided.

20 Claims, 4 Drawing Sheets

(58) Field of Classification Search
CPC ............. G02F 1/13452; G02F 1/13458; G02F 1/136286; H10D 86/60; H10D 86/441; H10K 59/131
See application file for complete search history.

(56) References Cited

U.S. PATENT DOCUMENTS

| | | | |
|---|---|---|---|
| 2006/0238450 A1* | 10/2006 | Onodera | G02F 1/13452 345/60 |
| 2013/0120704 A1 | 5/2013 | Chen et al. | |
| 2020/0355972 A1* | 11/2020 | Jian | G02F 1/1368 |
| 2021/0376039 A1* | 12/2021 | Jo | H10K 77/111 |
| 2022/0310763 A1* | 9/2022 | Cho | H10K 59/131 |

FOREIGN PATENT DOCUMENTS

| | | | | |
|---|---|---|---|---|
| CN | 105372891 A | | 3/2016 | |
| CN | 109557734 A | | 4/2019 | |
| CN | 109634003 A | * | 4/2019 | ........... G02F 1/1345 |
| CN | 110579917 A | * | 12/2019 | ......... G02F 1/13452 |
| CN | 111564111 A | | 8/2020 | |
| CN | 111681544 A | | 9/2020 | |
| CN | 111755465 A | | 10/2020 | |
| CN | 112037649 A | | 12/2020 | |
| CN | 212647220 U | | 3/2021 | |
| CN | 113126375 A | | 7/2021 | |
| IN | 111554194 A | | 8/2020 | |
| KR | 20170029688 A | | 3/2017 | |

\* cited by examiner

DISPLAY PANEL AND DISPLAY DEVICE

CROSS-REFERENCE TO RELATED APPLICATION

This application is the National Stage of PCT/CN2021/111410 filed on Aug. 9, 2021, which claims priority under 35 U.S.C. § 119 of Chinese Application No. CN 202110828557.4 filed on Jul. 22, 2021, the disclosure of which is incorporated by reference.

TECHNICAL FIELD

The present disclosure relates to a field of display technology, and more particularly to a display panel and a display device.

BACKGROUND

With development of full-screen display technology, currently, a screen-to-body ratio of a display is continuously increasing, and reducing a bottom bezel of the display has become one of main research directions of research and development personnel.

Figure 1:
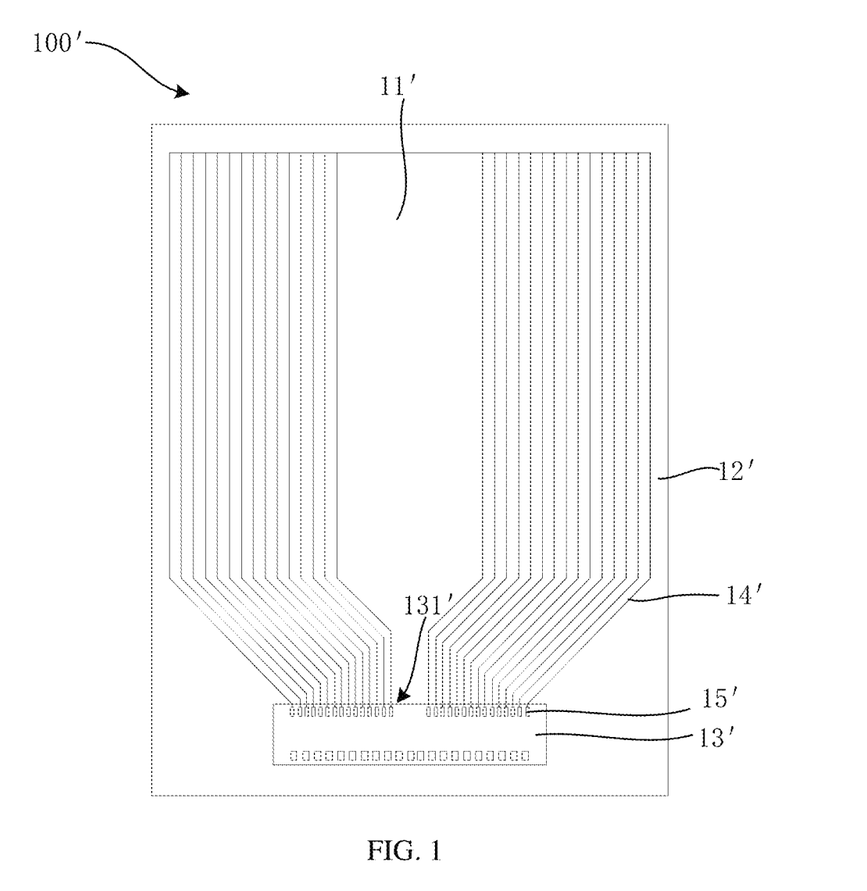
FIG. 1 is a schematic diagram of a plane structure of a conventional display panel.

As shown in FIG. 1, it is a schematic diagram of a plane structure of a display panel 100' in a conventional technology. The display panel 100' includes a display area 11' and a non-display area 12'. The non-display area 12' is provided with a drive chip 13' and a plurality of fan-out traces 14'. The drive chip 13' includes a plurality of output terminals 15', and the plurality of output terminals 15' are all disposed along an extending direction of a first side 131' of the drive chip 13' close to the display area 11'. The plurality of fan-out traces 14' are electrically connected with corresponding output terminals 15' through the first side 131', which is not conducive to realization of a narrow frame.

In summary, there is an urgent need to provide a new display panel and a display device to solve above technical problem.

SUMMARY

The present disclosure provides a display panel and a display device, so as to solve a technical problem that a plurality of fan-out traces of a conventional display panel are electrically connected with corresponding output terminals through a side of a drive chip close to a display area, which is not conducive to realization of a narrow frame.

In order to solve the above technical problem, technical solutions provided by the present disclosure are as follows:

The present disclosure provides a display panel, the display panel includes a substrate, the substrate is provided with a display area and a non-display area surrounding the display area, and the non-display area is provided with a drive chip and a fan-out area arranged between the drive chip and the display area;

wherein the drive chip comprises a first side close to the display area, two second sides connected with the first side, and a third side arranged opposite to the first side; the drive chip comprises a plurality of input terminals and a plurality of output terminals, the plurality of input terminals are arranged along an extension direction of the third side, the plurality of output terminals comprise a plurality of first output terminals and a plurality of second output terminals; the plurality of first output terminals are arranged along an extension direction of the first side, the plurality of second output terminals are disposed on a side of the plurality of first output terminals away from the display area, and the plurality of second output terminals are disposed in an area between the plurality of first output terminals and the plurality of input terminals; projections of the plurality of second output terminals on the third side and projections of the plurality of input terminals on the third side do not overlap; and wherein the fan-out area is provided with a plurality of fan-out traces, and the plurality of fan-out traces comprise a plurality of first fan-out traces and a plurality of second fan-out traces, each of the plurality of first fan-out traces is electrically connected with a corresponding first output terminal through the first side, each of the plurality of second fan-out traces is electrically connected with a corresponding second output terminal through an adjacent second side, and in a direction from close to the display area to away from the display area, the plurality of second fan-out traces are electrically connected with adjacent second output terminals in sequence.

According to the display panel provided by the present disclosure, the plurality of first output terminals are disposed right next to the second output terminals, and each of the plurality of second fan-out traces is electrically connected with an end of the corresponding second output terminal away from the display area.

According to the display panel provided by the present disclosure, an interval is defined between each of the plurality of first output terminals and each of the plurality of second output terminals.

According to the display panel provided by the present disclosure, each of the plurality of second fan-out traces is electrically connected with an end of the corresponding second output terminal close to the display area through the interval.

According to the display panel provided by the present disclosure, a part of second fan-out traces among the plurality of second fan-out traces are electrically connected with an end of the corresponding second output terminal away from the display area, and other part of second fan-out traces among the plurality of second fan-out traces are electrically connected with an end of the corresponding second output terminal close to the display area through the interval.

According to the display panel provided by the present disclosure, each of the plurality of second fan-out traces is electrically connected with an end of the corresponding second output terminal away from the display area.

According to the display panel provided by the present disclosure, each of the plurality of second fan-out traces comprises a first fan-out segment and a second fan-out segment that are connected with each other, the first fan-out segment is arranged along a direction of the display area pointing to the fan-out area, an orthographic projection of the first fan-out segment on the substrate does not overlap with an orthographic projection of the drive chip on the substrate, and the second fan-out segment is electrically connected with the corresponding second output terminal through the adjacent second side; and the display panel further comprises a test pad disposed on the substrate, the test pad comprises a first segment and a second segment, an orthographic projection of the first segment on the substrate falls within an orthographic projection of the interval on the substrate, and an orthographic projection of the second segment on the substrate overlaps the orthographic projection of the first fan-out segment on the substrate.

The present disclosure provides a display panel, display panel includes a substrate, wherein the substrate is provided with a display area and a non-display area surrounding the display area, and the non-display area is provided with a drive chip and a fan-out area arranged between the drive chip and the display area;

wherein the drive chip comprises a first side close to the display area, two second sides connected with the first side, and a third side arranged opposite to the first side; the drive chip comprises a plurality of input terminals and a plurality of output terminals, the plurality of input terminals are arranged along an extension direction of the third side, the plurality of output terminals comprise a plurality of first output terminals and a plurality of second output terminals; the plurality of first output terminals are arranged along an extension direction of the first side, the plurality of second output terminals are disposed on a side of the plurality of first output terminals away from the display area, and the plurality of second output terminals are disposed in an area between the plurality of first output terminals and the plurality of input terminals; and wherein the fan-out area is provided with a plurality of fan-out traces, and the plurality of fan-out traces comprise a plurality of first fan-out traces and a plurality of second fan-out traces, each of the plurality of first fan-out traces is electrically connected with a corresponding first output terminal through the first side, each of the plurality of second fan-out traces is electrically connected with a corresponding second output terminal through an adjacent second side.

According to the display panel provided by the present disclosure, in a direction from close to the display area to away from the display area, the plurality of second fan-out traces are electrically connected with adjacent second output terminals in sequence According to the display panel provided by the present disclosure, projections of the plurality of second output terminals on the third side and projections of the plurality of input terminals on the third side do not overlap.

According to the display panel provided by the present disclosure, the plurality of first output terminals are disposed right next to the second output terminal, and each of the plurality of second fan-out traces is electrically connected with an end of the corresponding second output terminal away from the display area.

According to the display panel provided by the present disclosure, an interval is defined between each of the plurality of first output terminals and each of the plurality of second output terminals.

According to the display panel provided by the present disclosure, each of the plurality of second fan-out traces is electrically connected with an end of the corresponding second output terminal close to the display area through the interval.

According to the display panel provided by the present disclosure, a part of second fan-out traces among the plurality of second fan-out traces are electrically connected with an end of the corresponding second output terminal away from the display area, and other part of second fan-out traces among the plurality of second fan-out traces are electrically connected with an end of the corresponding second output terminal close to the display area through the interval.

According to the display panel provided by the present disclosure, each of the plurality of second fan-out traces is electrically connected with an end of the corresponding second output terminal away from the display area.

According to the display panel provided by the present disclosure, each of the plurality of second fan-out traces comprises a first fan-out segment and a second fan-out segment that are connected with each other, the first fan-out segment is arranged along a direction of the display area pointing to the fan-out area, an orthographic projection of the first fan-out segment on the substrate does not overlap with an orthographic projection of the drive chip on the substrate, and the second fan-out segment is electrically connected with the corresponding second output terminal through the adjacent second side; and the display panel further comprises a test pad disposed on the substrate, the test pad comprises a first segment and a second segment, an orthographic projection of the first segment on the substrate falls within an orthographic projection of the interval on the substrate, and an orthographic projection of the second segment on the substrate overlaps the orthographic projection of the first fan-out segment on the substrate.

According to the display panel provided by the present disclosure, the plurality of first fan-out traces are electrically connected with the first segment through the plurality of first output terminals, and the plurality of second fan-out traces are electrically connected with the plurality of second output terminals through the second segment.

According to the display panel provided by the present disclosure, the display panel further comprises a flexible circuit board disposed on a side of the drive chip away from the display area, and the flexible circuit board is electrically connected with the input terminals.

According to the display panel provided by the present disclosure, the display area comprises a plurality of first signal traces and a plurality of second signal traces, each of the first signal traces is electrically connected with the corresponding first output terminal through a corresponding first fan-out trace, and each of the second signal traces is electrically connected with the corresponding second output terminal through a corresponding second fan-out trace.

The present disclosure provides a display device, the display device includes a display panel, wherein the display panel comprises a substrate, the substrate is provided with a display area and a non-display area surrounding the display area, and the non-display area is provided with a drive chip and a fan-out area arranged between the drive chip and the display area;

the drive chip comprises a first side close to the display area, two second sides connected with the first side, and a third side arranged opposite to the first side; the drive chip comprises a plurality of input terminals and a plurality of output terminals, the plurality of input terminals are arranged along an extension direction of the third side, the plurality of output terminals comprise a plurality of first output terminals and a plurality of second output terminals; the plurality of first output terminals are arranged along an extension direction of the first side, the plurality of second output terminals are disposed on a side of the plurality of first output terminals away from the display area, and the plurality of second output terminals are disposed in an area between the plurality of first output terminals and the plurality of input terminals; and the fan-out area is provided with a plurality of fan-out traces, and the plurality of fan-out traces comprise a plurality of first fan-out traces and a plurality of second fan-out traces, each of the plurality of first fan-out traces is electrically connected with a corresponding first output terminal through the first side, each of the plurality of second fan-out traces is electrically connected with a corresponding second output terminal through an adjacent second side.

The beneficial effects of the present disclosure are: in a display panel and a display device provided by the present disclosure, a plurality of first output terminals are disposed along an extending direction of a first side of a drive chip, a plurality of second output terminals are disposed on a side of a first output terminal away from a display area, and the plurality of second output terminals are disposed between the plurality of first output terminals and an input terminal. Each first fan-out trace is electrically connected with a corresponding first output terminal through a first side, and each second fan-out trace is electrically connected with a corresponding second output terminal through a second side of an adjacent drive chip. A plurality of first fan-out traces are further compressed, so that a width of a fan-out area is reduced, so that the drive chip can be moved upward as a whole, thereby reducing a lower frame of the display panel and realizing a narrow frame design.

DESCRIPTION OF DRAWINGS

In order to explain the embodiments of the present disclosure more clearly, the following briefly introduces the drawings that need to be used in the embodiments. The drawings in the following description are only part of the embodiments of the present disclosure. For those of ordinary skill in the art, other drawings can be obtained based on these drawings without creative work.

DESCRIPTION OF REFERENCE SIGNS 100, display panel; 10, substrate; 11, display area; 12, non-display area; 13, drive chip; 131, first side 132, second side; 133, third side; 134, interval; 14, fan-out area; 15, first output terminal; 16, second output terminal; 17, first fan-out trace; 18, second fan-out trace; 181, first fan-out segment; 182, second fan-out segment; 19, input terminal; 20, test pad; 201, first segment; 202, second segment; 21, flexible circuit board; 22, first signal trace; 23, second signal trace.

DETAILED DESCRIPTION OF PREFERRED EMBODIMENTS

The following will be combined with drawings in the embodiments of the present disclosure, a clear and complete description of the technical solutions in the embodiments of the present disclosure. Obviously, the described embodiments are only a part of the embodiments of the present disclosure, rather than all the embodiments. Based on the embodiments in the present disclosure, all other embodiments obtained by those skilled in the art without creative work shall fall within the protection scope of the present disclosure. In addition, it should be understood that the specific implementations described here are only used to illustrate and explain the present disclosure, and are not used to limit the present disclosure. In the present disclosure, unless otherwise stated, the orientation words used such as "upper" and "lower" usually refer to the upper and lower positions of the device in actual use or working state, and specifically refer to the directions of the drawings in the drawings; and "inner" and "outer" are in terms of the outline of the device.

Figure 2:
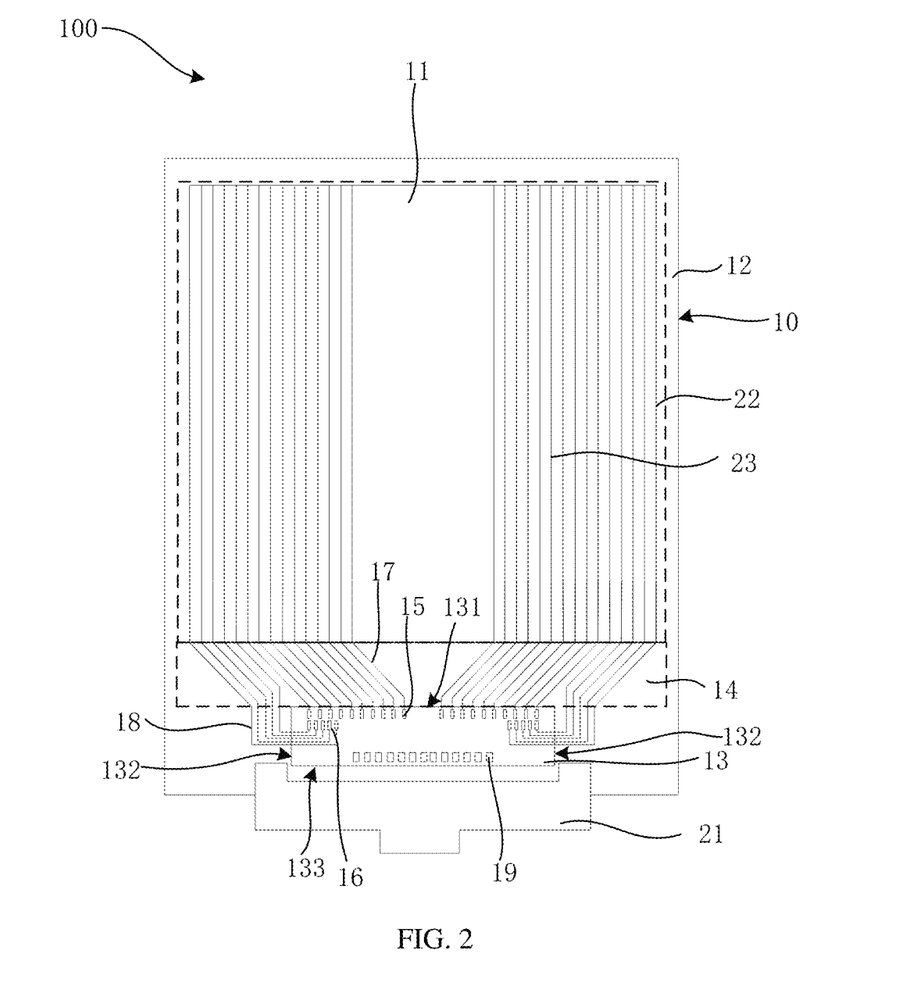
FIG. 2 is a schematic diagram of a plane structure of a display panel provided by an embodiment of the present disclosure.

Please refer to FIG. 2, FIG. 2 is a schematic diagram of a plane structure of a display panel provided by an embodiment of the present disclosure. The present disclosure provides a display panel 100, the display panel 100 includes a substrate 10, the substrate 10 is provided with a display area 11 and a non-display area 12 surrounding the display area 11, and the non-display area 12 is provided with a drive chip 13 and a fan-out area 14 disposed between the drive chip 13 and the display area 11.

The drive chip 13 includes a first side 131 close to the display area 11, two second sides 132 connected with the first side 131, and a third side 133 arranged opposite to the first side 131. The two second sides 132 are arranged opposite to each other, the third side 133 is arranged opposite to the first side 131, and the third side 133 is connected with the two second sides 132 respectively.

Optionally, a shape of the drive chip 13 is rectangular. The first side 131 and the two second sides 132 are perpendicular to each other. The third side 133 and the second sides 132 are perpendicular to each other. The first side 131 and the third side 133 are parallel to each other. Of course, the drive chip 13 may also have other shapes, and the embodiments of the present disclosure is not limited this.

The drive chip 13 includes a plurality of input terminals 19 and a plurality of output terminals, and the plurality of input terminals 19 are disposed along an extending direction of the third side 133. The plurality of output terminals includes a plurality of first output terminals 15 and a plurality of second output terminals 16, the plurality of first output terminals 15 are arranged along an extending direction of the first side 131, and the plurality of second output terminals 16 are disposed on a side of the plurality of first output terminals 15 away from the display area 11. The plurality of second output terminals 16 are disposed in an area between the plurality of first output terminals 15 and the plurality of input terminals 19.

The fan-out area 14 is provided with a plurality of fan-out traces, and the plurality of fan-out traces include a plurality of first fan-out traces 17 and a plurality of second fan-out traces 18, each of the plurality of first fan-out traces 17 is electrically connected with a corresponding first output terminal 15 through the first side 131, each of the plurality of second fan-out traces 18 is electrically connected with a corresponding second output terminal 16 through the second sides 132.

It should be noted that, in a traditional display panel, all output terminals are arranged along the extending direction of the first side 131 of the drive chip 13, and all fan-out traces connected with the output terminals are electrically connected with the plurality of output terminals through the first side 131. The plurality of fan-out traces connected with the plurality of output terminals located in a middle area of the drive chip have a space that can be further compressed. However, the plurality of fan-out traces connected with the plurality of output terminals on left and right sides of the drive chip cannot be further compressed, resulting in a larger width of the fan-out area 14, which is not conducive to realization of a narrow frame.

In view of this, a difference between the display panel 100 provided by the present disclosure and the prior art is that the present disclosure divides all output terminals and all fan-out traces into two categories. Specifically, the plurality of output terminals located in a middle area of the drive chip 13 are the plurality of first output terminals 15, and the plurality of output terminals located in left and right areas of the drive chip 13 are the second output terminals 16. Correspondingly, the plurality of fan-out traces electrically connected with the plurality of first output terminal 15 are the plurality of first fan-out traces 17, and the plurality of fan-out traces electrically connected with the plurality of second output terminal 16 are the plurality of second fan-out traces 18.

It can be understood that a key point of the present disclosure is that the plurality of second output terminals 16 are disposed on a side of the plurality of first output terminals 15 away from the first side 131, and each of the plurality of second fan-out traces 18 is electrically connected with a corresponding second output terminal 16 through a second side 132 of the drive chip 13. Since the plurality of second fan-out traces 18 do not pass through the first side 131, and an arrangement design of the plurality of first fan-out traces 17 connected with the plurality of first output terminals 15 is not limited by the plurality of second fan-out traces 18. Therefore, the plurality of first fan-out traces 17 can be further compressed, so that a width of the fan-out area 14 for placing the plurality of fan-out traces is further reduced. As a result, the drive chip 13 can be moved upward as a whole, thereby reducing a lower frame of the display panel 100, which is beneficial to realize a narrow frame design.

Further, the display panel in the prior art usually uses a conventional drive chip. All output terminals of the conventional drive chip are usually disposed on a side close to the display area and arranged in a single row. If the drive chip 13 used in the present disclosure is improved based on a conventional drive chip, entire second output terminals 16 are directly translated to a side of the plurality of first output terminals 15 away from the display area 11, namely, the plurality of first output terminals 15 and the plurality of second output terminals 16 are arranged in different rows. However, in order to prevent a short circuit between the plurality of second fan-out traces 18, a second fan-out trace 18 located on an outer side need to be electrically connected with a corresponding second output terminal 16 located on an inner side, and a second fan-out trace 18 located on the inner side need to be electrically connected with a corresponding second output terminal 16 located on the outer side. This will cause an arrangement sequence of an end of a second fan-out trace 18 electrically connected with a corresponding second output terminal 16 along the extending direction of the first side 131 to not be consistent with an arrangement sequence of a second output terminal 16 along the extension direction of the first side 131. As a result, a second fan-out trace 18 is not electrically connected with a corresponding second output terminal 16, resulting in a signal transmission disorder and poor display.

Figure 3:
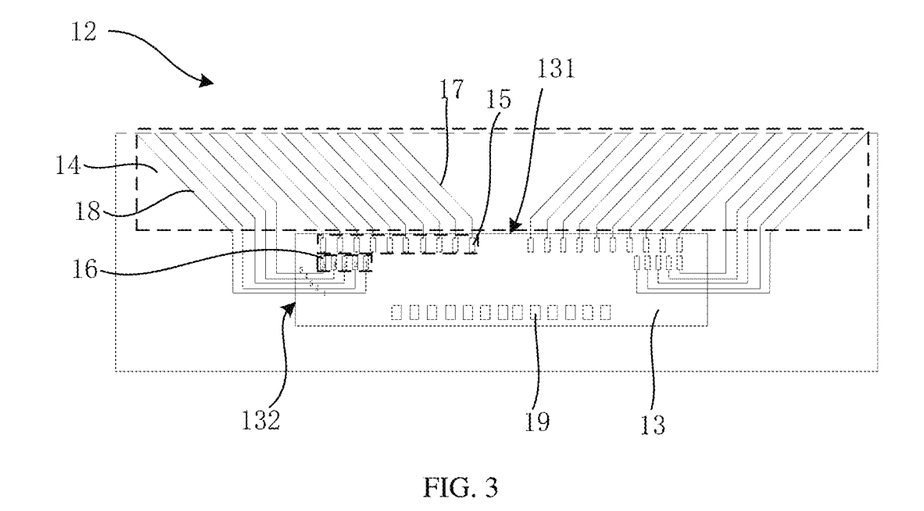
FIG. 3 is a schematic diagram of a first partial structure of a non-display area of a display panel provided by an embodiment of the present disclosure.
Figure 4:
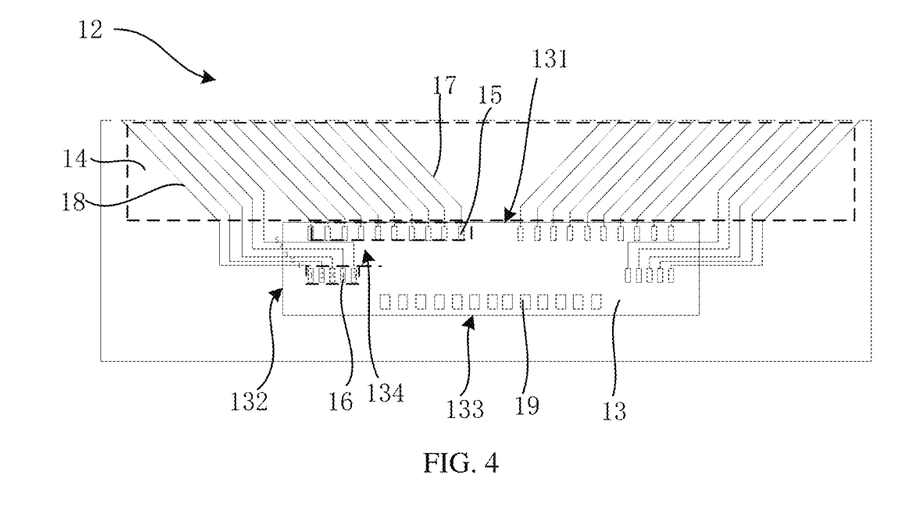
FIG. 4 is a schematic diagram of a second partial structure of a non-display area of a display panel provided by an embodiment of the present disclosure.
Figure 5:
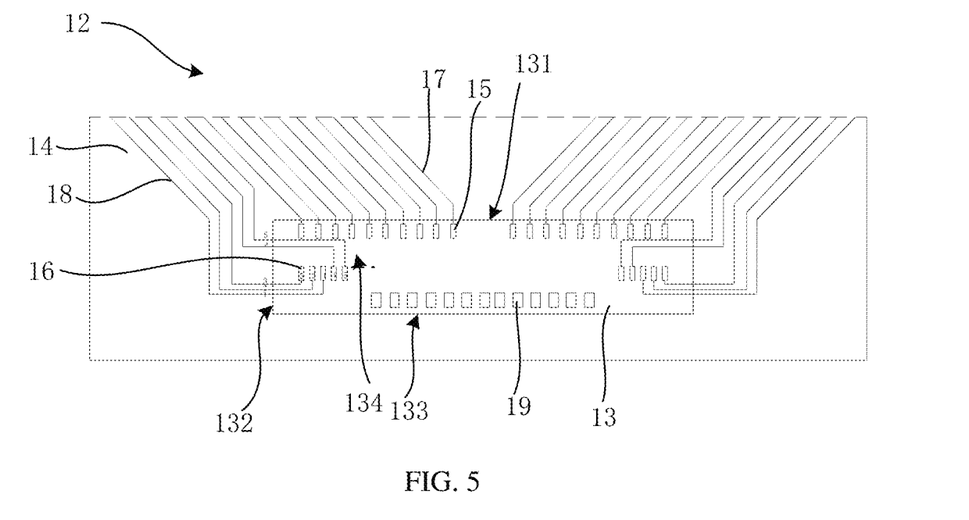
FIG. 5 is a schematic diagram of a third partial structure of a non-display area of a display panel provided by an embodiment of the present disclosure.

Please refer to FIG. 3 to FIG. 5, a difference between the drive chip 13 provided in the present disclosure and the conventional drive chip in the prior art is that: keeping positions of the plurality of first output terminals 15 unchanged, the plurality of first output terminals 15 are still arranged along the extending direction of the first side 131, and the plurality of second output terminals 16 arranged along the extending direction of the first side 131 are moved to a side of the plurality of first output terminals 15 away from the display area 11.

According to a specific arrangement of the second fan-out trace 18, the arrangement sequence of the plurality of second output terminals 16 is selectively redesigned, so that each of the plurality of second fan-out traces 18 is electrically connected with an adjacent second output terminal 16 in a direction from close to the display area 11 to far away from the display area 11, to ensure that the arrangement sequence of the end of the plurality of second fan-out traces 18 electrically connected with the corresponding second output terminal 16 is same as the arrangement sequence of the plurality of second output terminals 16. Therefore, it is ensured that each of the plurality of second fan-out traces 18 is electrically connected with a corresponding second output terminal 16 to prevent the signal transmission disorder.

Further, projections of the plurality of second output terminals 16 on the third side 133 and projections of the plurality of input terminals 19 on the third side 133 do not overlap, leaving a trace space for the second fan-out traces 18 to prevent an interference with traces connected with the plurality of input terminals 19.

It should be noted that, in order to clearly describe a technical solution provided by the present disclosure, in the embodiments of the present disclosure, the plurality of second fan-out traces 18 respectively include 5 fan-out traces on left and right sides of the fan-out area 14, and the plurality of second output terminals 16 respectively include 5 output terminals on left and right sides of the drive chip 13, which are taken as an example for explanation.

In one embodiment, please refer to FIG. 3, FIG. 3 is a schematic diagram of a first partial structure of the non-display area of the display panel provided by an embodiment of the present disclosure. The plurality of second output terminals 16 are disposed right next to the plurality of first output terminals 15, and each of the plurality of second fan-out traces 18 is electrically connected with an end of a corresponding second output terminal 16 away from the display area 11. It should be noted that the plurality of second output terminals 16 are disposed right next to the plurality of first output terminals 15 means that, there is an interval between each of the plurality of second output terminals 16 and each of the plurality of first output terminals 15, but the interval is too small to provide a trace space for the second fan-out trace 18. The second fan-out trace 18 can only be routed from a side of the second output terminals 16 away from the display area 11 to make full use of a lower frame of the display panel 100.

Specifically, in a direction from close to the display area 11 to far away from the display area 11, the plurality of second fan-out traces 18 include a first second fan-out trace, a second second fan-out trace, . . . , and a fifth second fan-out trace arranged in sequence. The arrangement sequence of the second output terminals 16 is redesigned, so that in a direction from close to an adjacent second side 132 to far away from the adjacent second side 132, the plurality of second output terminals 16 include a fifth second output terminal, a fourth second output terminal, . . . , a first second output terminal arranged in sequence. Wherein, the first second fan-out trace is electrically connected with the first second output terminal through the second side 132, the second second fan-out trace is electrically connected with the second second output terminal through the second side 132, . . . , and the fifth second fan-out trace is electrically connected with the fifth second output terminal through the second side 132.

It is understandable that the fan-out trace arrangement design in the embodiments of the present disclosure, on a premise of avoiding a short circuit between the plurality of second fan-out traces 18, each of the plurality of second fan-out traces 18 can be electrically connected with a corresponding second output terminal 16. Therefore, it is possible to prevent poor display caused by the signal transmission disorder due to an inconsistent sequence of the two.

In one embodiment, please refer to FIG. 4, FIG. 4 is a schematic diagram of a second partial structure of the non-display area of the display panel provided by an embodiment of the present disclosure. There is an interval 134 between each of the first output terminals 15 and each of the second output terminals 16. Each of the plurality of second fan-out traces 18 may be electrically connected with an end of a corresponding second output terminal 16 close to the display area 11 through the interval 134. The interval 134 is used to leave a trace space for the second fan-out trace 18. The second fan-out trace 18 may be routed from a side of the second output terminal 16 close to the display area 11, Therefore, a space on a side of the second output terminals 16 away from the display area 11 can be reduced, which is beneficial to reduce the lower frame of the display panel 100.

Specifically, in the direction from close to the display area 11 to far away from the display area 11, the plurality of second fan-out traces 18 include the first second fan-out trace, the second second fan-out trace, . . . , the fifth second fan-out trace arranged in sequence. There is no need to redesign the arrangement sequence of the second output terminals 16, in the direction from close to an adjacent second side 132 to far away from the adjacent second side 132, the plurality of second output terminals 16 include a first second output terminal, a second second output terminal, . . . , a fifth second output terminal arranged in sequence. Wherein, the first second fan-out trace is electrically connected with the first second output terminal through the second side 132, the first second second fan-out trace is electrically connected with the second second output terminal through the second side 132, . . . , and the fifth second fan-out trace is electrically connected with the fifth second output terminal through the second side 132.

Similarly, the fan-out trace arrangement design in the embodiments of the present disclosure, on a premise of avoiding a short circuit between the plurality of second fan-out traces 18, each of the plurality of second fan-out traces 18 can be electrically connected with a corresponding second output terminal 16. Therefore, it is possible to prevent poor display caused by the signal transmission disorder due to the inconsistent sequence of the two.

In one embodiment, please refer to FIG. 5, FIG. 5 is a schematic diagram of a third partial structure of the non-display area of the display panel provided by an embodiment of the present disclosure. There is an interval 134 between each of the first output terminals 15 and each of the second output terminals 16, and the interval 134 is used to leave the trace space for the plurality of second fan-out traces 18. A difference between FIG. 5 and FIG. 4 is that, a part of the plurality of second fan-out traces 18 among the plurality of second fan-out traces 18 is electrically connected with an end of the corresponding second output terminal 16 away from the display area 11, and other part of the plurality of second fan-out traces 18 among the plurality of second fan-out traces 18 is electrically connected with an end of the corresponding second output terminal 16 close to the display area 11.

Specifically, in the direction from close to the display area 11 to far away from the display area 11, the plurality of second fan-out traces 18 include the first second fan-out trace, the second second fan-out trace, . . . , the fifth second fan-out trace arranged in sequence. An arrangement sequence of the second output terminal 16 needs to be redesigned, so that in the direction from close to an adjacent second side 132 to far away from the adjacent second side 132, the plurality of second output terminals 16 include a third second output terminal, a second second output terminal, a first second output terminal, a fourth second output terminal, and a fifth second output terminal that are arranged in sequence. Wherein, the first second fan-out trace is electrically connected with the first second output terminal through the second side 132, the first second second fan-out trace is electrically connected with the second second output terminal through the second side 132, . . . , and the fifth second fan-out trace is electrically connected with the fifth second output terminal through the second side 132.

It should be noted that, in this embodiment, the first second fan-out trace is electrically connected with an end of the first second output terminal away from the display area 11, the second second fan-out trace is electrically connected with an end of the second second output terminal away from the display area 11, the third second fan-out trace is electrically connected with an end of the third second output terminal away from the display area 11, the fourth second fan-out trace is electrically connected with an end of the fourth second output terminal close to the display area 11, and the fifth second fan-out trace is electrically connected with an end of the fifth second output terminal close to the display area 11. Of course, in other embodiments, any one or more of the plurality of second fan-out traces may be electrically connected with one of an end close to the display area 11 or an end far away from the display area 11, and remaining second fan-out traces can be electrically connected with another type.

Figure 6:
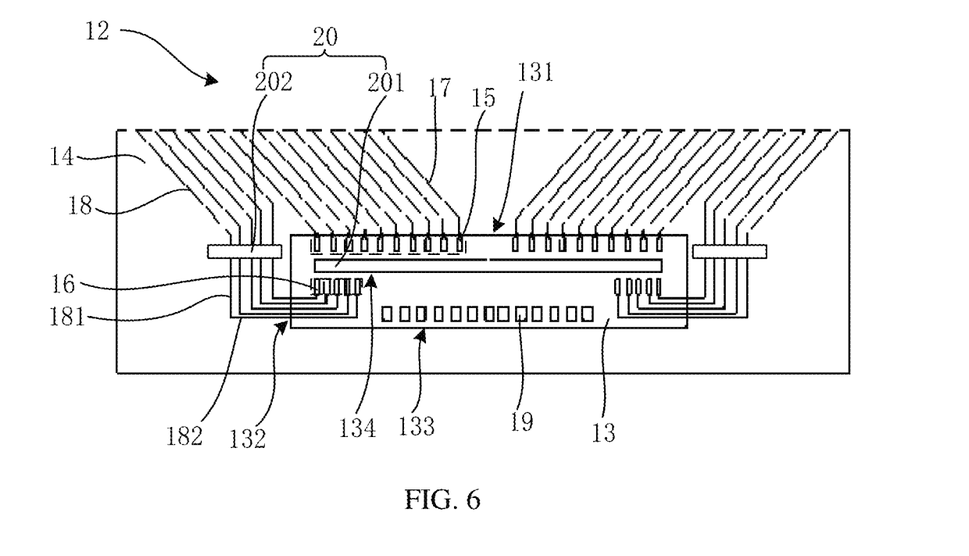
FIG. 6 is a schematic diagram of a fourth partial structure of a non-display area of a display panel provided by an embodiment of the present disclosure.

In one embodiment, please refer to FIG. 6, FIG. 6 is a schematic diagram of a fourth partial structure of the non-display area of the display panel provided by an embodiment of the present disclosure. FIG. 6 is an improvement based on FIG. 3. Of course, same improvement can also be made to other embodiments, which will not be described in detail here.

Specifically, the second fan-out trace 18 includes a first fan-out segment 181 and a second fan-out segment 182 that are connected with each other. The first fan-out segment 181 is arranged along a direction the display area 11 points to the fan-out area 14, and an orthographic projection of the first fan-out segment 181 on the substrate 10 and an orthographic projection of the drive chip 13 on the substrate 10 do not overlap. The second fan-out segment 182 is electrically connected with a corresponding second output terminal 16 through an adjacent second side 132. Generally, the first fan-out segment 181 is a vertical trace.

Furthermore, the display panel 100 further includes a test pad 20 disposed on the substrate 10, the test pad 20 is configured for screen detection of the display panel 100. Before bonding the display panel 100, a data signal and a clock signal can be sent to the display area 11 of the display panel 100 through the test pad 20, so as to realize the screen detection of the display panel 100. Through screen detection, it can be determined whether the display panel 100 has a display abnormality. If there is a display abnormality, a cause of the display abnormality can be found in time and the abnormality can be handled before bonding. The bonding is performed after display is normal to ensure that a display function of the display panel 100 after the bonding is normal, which is beneficial to improve a production yield of the display panel 100. If the detection is performed after bonding, workloads of rework processing when the display is abnormal is relatively large, and the production yield of the display panel 100 will be greatly reduced.

The plurality of second fan-out traces 18 in the present disclosure adopt the design of the first fan-out segment 181 and the second fan-out segment 182. At the same time, the embodiments of the present disclosure also adaptively improve the test pad 20. Specifically, since the first fan-out segment 181 is a vertical trace, it will not restrict a setting of the test pad 20, and the second fan-out segment 182 is a non-vertical trace, which will cause limitations to the setting of the test pad 20. Therefore, the test pad 20 of the embodiment of the present disclosure adopts a segmented design, namely, the test pad includes a first segment 201 and a second segment 202, an orthographic projection of the first segment 201 on the substrate 10 falls within an orthographic projection of the interval 134 on the substrate 10, and an orthographic projection of the second segment 202 on the substrate 10 overlaps an orthographic projection of the first fan-out segment 181 on the substrate 10. In other words, the second segment 202 is located outside an area where the drive chip is located, and the second segment 202 is arranged corresponding to the first fan-out segment 181.

Specifically, each of the plurality of first fan-out traces 17 is electrically connected with the first segment 201 through the first output terminal 15, namely, each of the plurality of first fan-out traces 17 is electrically connected with the first segment 201 first, and then electrically connected with the first output terminal 15. Before the drive chip 13 is bound, the first segment 201 is configured to provide a test signal to each of the plurality of first fan-out traces 17 for screen detection. Correspondingly, each of the plurality of second fan-out traces 18 is electrically connected with a second output terminal 16 through the second segment 202, namely, the second fan-out trace 18 is electrically connected with the second output terminal 16 first, and then electrically connected with the second segment 202. The second segment 202 is configured to provide a test signal to each of the plurality of second fan-out traces 18 to detect an image before the drive chip 13 is bound.

Furthermore, please continue to refer to FIG. 2, the display panel 100 further includes a flexible circuit board 21 disposed on a side of the drive chip 13 away from the display area 11, and the flexible circuit board 21 is electrically connected with the input terminals 19. A signal transmitted to the display area 11 is usually first transmitted to the input terminals 19 through the flexible circuit board 21, and then transmitted to the output terminals by the input terminals 19 and internal traces of the drive chip 13, and transmitted to the display area 11 through the output terminals and the fan-out traces.

Furthermore, the display panel 100 further includes a plurality of signal traces, the plurality of signal traces are disposed in the display area 11, and each of the plurality of signal traces is electrically connected with a corresponding fan-out trace. In terms of a location, the plurality of signal traces include a plurality of first signal traces 22 and a plurality of second signal traces 23, each of the plurality of first signal traces 22 is electrically connected with a corresponding first output terminal 15 through a corresponding first fan-out trace 17, and each of the plurality of second signal traces 23 is electrically connected with a corresponding second output terminal 16 through a corresponding second fan-out trace 18. In terms of a function, the plurality of signal traces may include a plurality of data signal traces and a plurality of touch signal traces, an arrangement of the data signal traces is same as an arrangement of the touch signal traces, and the data signal traces are insulated from the touch signal traces. The flexible circuit board 21 in the present disclosure sends a control signal to the touch signal trace through the drive chip 13, and the drive chip 13 sends data signals to the data signal traces.

The present disclosure also provides a display device, which includes the above-mentioned display panel 100. The display device can be any product or component with a display function, such as a mobile phone, a tablet computer, a television, a monitor, a notebook computer, a digital photo frame, a navigator, and so on.

Beneficial effects are: in a display panel and a display device provided by the embodiments of the present disclosure, a plurality of first output terminals are disposed along an extending direction of a first side of a drive chip, a plurality of second output terminals are disposed on a side of a first output terminal away from a display area, and the plurality of second output terminals are disposed between the plurality of first output terminals and an input terminal. Each first fan-out trace is electrically connected with a corresponding first output terminal through a first side, and each second fan-out trace is electrically connected with a corresponding second output terminal through a second side of an adjacent drive chip. A plurality of the first fan-out traces are further compressed, so that a width of a fan-out area is reduced, so that the drive chip can be moved upward as a whole, thereby reducing a lower frame of the display panel and realizing a narrow frame design.

In summary, although the present disclosure has been disclosed as above in preferred embodiments, the above preferred embodiments are not intended to limit the present disclosure. Those of ordinary skill in the art can make various changes and modifications without departing from the spirit and scope of the present disclosure. Therefore, the protection scope of the present disclosure is subject to the scope defined by the claims.

What is claimed is:
1. A display panel, comprising:
a substrate, wherein the substrate is provided with a display area and a non-display area surrounding the display area, and the non-display area is provided with a drive chip and a fan-out area arranged between the drive chip and the display area;
wherein the drive chip comprises a first side close to the display area, two second sides connected with the first side, and a third side arranged opposite to the first side; the drive chip comprises a plurality of input terminals and a plurality of output terminals, the plurality of input terminals are arranged along an extension direction of the third side, the plurality of output terminals comprise a plurality of first output terminals and a plurality of second output terminals; the plurality of first output terminals are arranged along an extension direction of the first side, the plurality of second output terminals are disposed on a side of the plurality of first output terminals away from the display area, and the plurality of second output terminals are disposed in an area between the plurality of first output terminals and the plurality of input terminals; projections of the plurality of second output terminals on the third side and projections of the plurality of input terminals on the third side do not overlap; and wherein the fan-out area is provided with a plurality of fan-out traces, and the plurality of fan-out traces comprise a plurality of first fan-out traces and a plurality of second fan-out traces, each of the plurality of first fan-out traces is electrically connected with a corresponding first output terminal through the first side, each of the plurality of second fan-out traces is electrically connected with a corresponding second output terminal through an adjacent second side, and in a direction from close to the display area to away from the display area, the plurality of second fan-out traces are electrically connected with adjacent second output terminals in sequence.

2. The display panel of claim 1, wherein the plurality of first output terminals are disposed right next to the second output terminals, and each of the plurality of second fan-out traces is electrically connected with an end of the corresponding second output terminal away from the display area.

3. The display panel of claim 1, wherein an interval is defined between each of the plurality of first output terminals and each of the plurality of second output terminals.

4. The display panel of claim 3, wherein each of the plurality of second fan-out traces is electrically connected with an end of the corresponding second output terminal close to the display area through the interval.

5. The display panel of claim 3, wherein a part of second fan-out traces among the plurality of second fan-out traces are electrically connected with an end of the corresponding second output terminal away from the display area, and other part of second fan-out traces among the plurality of second fan-out traces are electrically connected with an end of the corresponding second output terminal close to the display area through the interval.

6. The display panel of claim 3, wherein each of the plurality of second fan-out traces is electrically connected with an end of the corresponding second output terminal away from the display area.

7. The display panel of claim 6, wherein each of the plurality of second fan-out traces comprises a first fan-out segment and a second fan-out segment that are connected with each other, the first fan-out segment is arranged along a direction of the display area pointing to the fan-out area, an orthographic projection of the first fan-out segment on the substrate does not overlap with an orthographic projection of the drive chip on the substrate, and the second fan-out segment is electrically connected with the corresponding second output terminal through the adjacent second side; and the display panel further comprises a test pad disposed on the substrate, the test pad comprises a first segment and a second segment, an orthographic projection of the first segment on the substrate falls within an orthographic projection of the interval on the substrate, and an orthographic projection of the second segment on the substrate overlaps the orthographic projection of the first fan-out segment on the substrate.

8. A display panel, comprising a substrate, wherein the substrate is provided with a display area and a non-display area surrounding the display area, and the non-display area is provided with a drive chip and a fan-out area arranged between the drive chip and the display area;

wherein the drive chip comprises a first side close to the display area, two second sides connected with the first side, and a third side arranged opposite to the first side; the drive chip comprises a plurality of input terminals and a plurality of output terminals, the plurality of input terminals are arranged along an extension direction of the third side, the plurality of output terminals comprise a plurality of first output terminals and a plurality of second output terminals; the plurality of first output terminals are arranged along an extension direction of the first side, the plurality of second output terminals are disposed on a side of the plurality of first output terminals away from the display area, and the plurality of second output terminals are disposed in an area between the plurality of first output terminals and the plurality of input terminals; and wherein the fan-out area is provided with a plurality of fan-out traces, and the plurality of fan-out traces comprise a plurality of first fan-out traces and a plurality of second fan-out traces, each of the plurality of first fan-out traces is electrically connected with a corresponding first output terminal through the first side, each of the plurality of second fan-out traces is electrically connected with a corresponding second output terminal through an adjacent second side.

9. The display panel of claim 8, wherein in a direction from close to the display area to away from the display area, the plurality of second fan-out traces are electrically connected with adjacent second output terminals in sequence.

10. The display panel of claim 8, wherein projections of the plurality of second output terminals on the third side and projections of the plurality of input terminals on the third side do not overlap.

11. The display panel of claim 8, wherein the plurality of first output terminals are disposed right next to the second output terminal, and each of the plurality of second fan-out traces is electrically connected with an end of the corresponding second output terminal away from the display area.

12. The display panel of claim 8, wherein an interval is defined between each of the plurality of first output terminals and each of the plurality of second output terminals.

13. The display panel of claim 12, wherein each of the plurality of second fan-out traces is electrically connected with an end of the corresponding second output terminal close to the display area through the interval.

14. The display panel of claim 12, wherein a part of second fan-out traces among the plurality of second fan-out traces are electrically connected with an end of the corresponding second output terminal away from the display area, and other part of second fan-out traces among the plurality of second fan-out traces are electrically connected with an end of the corresponding second output terminal close to the display area through the interval.

15. The display panel of claim 12, wherein each of the plurality of second fan-out traces is electrically connected with an end of the corresponding second output terminal away from the display area.

16. The display panel of claim 15, wherein each of the plurality of second fan-out traces comprises a first fan-out segment and a second fan-out segment that are connected with each other, the first fan-out segment is arranged along a direction of the display area pointing to the fan-out area, an orthographic projection of the first fan-out segment on the substrate does not overlap with an orthographic projection of the drive chip on the substrate, and the second fan-out segment is electrically connected with the corresponding second output terminal through the adjacent second side; and the display panel further comprises a test pad disposed on the substrate, the test pad comprises a first segment and a second segment, an orthographic projection of the first segment on the substrate falls within an orthographic projection of the interval on the substrate, and an orthographic projection of the second segment on the substrate overlaps the orthographic projection of the first fan-out segment on the substrate.

17. The display panel of claim 16, wherein the plurality of first fan-out traces are electrically connected with the first segment through the plurality of first output terminals, and the plurality of second fan-out traces are electrically connected with the plurality of second output terminals through the second segment.

18. The display panel of claim 8, wherein the display panel further comprises a flexible circuit board disposed on a side of the drive chip away from the display area, and the flexible circuit board is electrically connected with the input terminals.

19. The display panel of claim 8, wherein the display area comprises a plurality of first signal traces and a plurality of second signal traces, each of the first signal traces is electrically connected with the corresponding first output terminal through a corresponding first fan-out trace, and each of the second signal traces is electrically connected with the corresponding second output terminal through a corresponding second fan-out trace.

20. A display device, comprising a display panel, wherein the display panel comprises a substrate, the substrate is provided with a display area and a non-display area surrounding the display area, and the non-display area is provided with a drive chip and a fan-out area arranged between the drive chip and the display area;

wherein the drive chip comprises a first side close to the display area, two second sides connected with the first side, and a third side arranged opposite to the first side; the drive chip comprises a plurality of input terminals and a plurality of output terminals, the plurality of input terminals are arranged along an extension direction of the third side, the plurality of output terminals comprise a plurality of first output terminals and a plurality of second output terminals; the plurality of first output terminals are arranged along an extension direction of the first side, the plurality of second output terminals are disposed on a side of the plurality of first output terminals away from the display area, and the plurality of second output terminals are disposed in an area between the plurality of first output terminals and the plurality of input terminals; and wherein the fan-out area is provided with a plurality of fan-out traces, and the plurality of fan-out traces comprise a plurality of first fan-out traces and a plurality of second fan-out traces, each of the plurality of first fan-out traces is electrically connected with a corresponding first output terminal through the first side, each of the plurality of second fan-out traces is electrically connected with a corresponding second output terminal through an adjacent second side.

* * * * *